(12) United States Patent
Sundgren et al.

(10) Patent No.: US 11,063,182 B2
(45) Date of Patent: Jul. 13, 2021

(54) OPTOELECTRONIC COMPONENT AND METHOD OF MANUFACTURING AN OPTOELECTRONIC COMPONENT

(71) Applicant: OSRAM Opto Semiconductors GmbH, Regensburg (DE)

(72) Inventors: Petrus Sundgren, Lappersdorf (DE); Wolfgang Schmid, Gundelshausen (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/499,490

(22) PCT Filed: May 17, 2018

(86) PCT No.: PCT/EP2018/063003
§ 371 (c)(1),
(2) Date: Sep. 30, 2019

(87) PCT Pub. No.: WO2018/219681
PCT Pub. Date: Dec. 6, 2018

(65) Prior Publication Data
US 2021/0005786 A1    Jan. 7, 2021

(30) Foreign Application Priority Data

Jun. 1, 2017    (DE) .......................... 102017112127.7

(51) Int. Cl.
*H01L 33/38*    (2010.01)
*H01L 33/00*    (2010.01)
(Continued)

(52) U.S. Cl.
CPC ........ *H01L 33/382* (2013.01); *H01L 33/0025* (2013.01); *H01L 33/025* (2013.01);
(Continued)

(58) Field of Classification Search
CPC ..... H01L 33/30; H01L 33/382; H01L 33/145; H01L 33/025; H01L 33/0025; H01L 33/14; H01L 33/305
See application file for complete search history.

(56) References Cited

U.S. PATENT DOCUMENTS 5,684,309 A    11/1997    McIntosh et al.
5,831,277 A    11/1998    Razeghi
(Continued)

FOREIGN PATENT DOCUMENTS

DE    10 2010 013 494    10/2011
DE    10 2010 026 518    1/2012
(Continued)

*Primary Examiner* — Savitri Mulpuri
(74) *Attorney, Agent, or Firm* — DLA Piper LLP (US)

(57) ABSTRACT

An optoelectronic component includes first and second semiconductor layers and an active layer that generates electromagnetic radiation, wherein the active layer is disposed between the first and second semiconductor layers, a recess in the first semiconductor layer, a front side provided for coupling out the electromagnetic radiation, a first electrical connection layer and a second electrical connection layer disposed on a rear side opposite the front side, wherein the first electrical connection layer is arranged at least partially in the recess, and a contact zone with a dopant of a second conductivity type different from the first conductivity type, wherein the contact zone adjoins the recess, and the first semiconductor layer and the second semiconductor layer are highly doped to prevent diffusion of the dopant from the contact zone into the first semiconductor layer and diffusion of the dopant from the contact zone into the second semiconductor layer.

19 Claims, 9 Drawing Sheets

(51) Int. Cl.
  *H01L 33/14* (2010.01)
  *H01L 33/30* (2010.01)
  *H01L 33/02* (2010.01)

(52) U.S. Cl.
  CPC ............ *H01L 33/14* (2013.01); *H01L 33/145* (2013.01); *H01L 33/30* (2013.01); *H01L 33/305* (2013.01)

(56) References Cited

U.S. PATENT DOCUMENTS

| | | | |
|---|---|---|---|
| 6,144,043 | A | 11/2000 | Ogihara et al. |
| 6,172,382 | B1 | 1/2001 | Nagahama et al. |
| 6,278,136 | B1 | 8/2001 | Nitta |
| 6,849,881 | B1 | 2/2005 | Harle et al. |
| 6,869,820 | B2 * | 3/2005 | Chen ............... H01L 33/46 257/E33.068 |
| 2003/0230754 | A1 | 12/2003 | Steigerwald et al. |
| 2009/0321775 | A1 * | 12/2009 | Hasnain ............ H01L 33/382 257/99 |
| 2011/0095320 | A1 * | 4/2011 | Hwang ............... H01L 33/20 257/98 |
| 2013/0062657 | A1 | 3/2013 | Fang et al. |
| 2013/0099272 | A1 * | 4/2013 | von Malm ......... H01L 25/0753 257/99 |
| 2013/0175573 | A1 | 7/2013 | Mayer et al. |
| 2015/0014716 | A1 * | 1/2015 | von Malm ............. H01L 27/15 257/89 |
| 2015/0325598 | A1 * | 11/2015 | Pfeuffer ............... H01L 25/167 257/59 |
| 2016/0049543 | A1 | 2/2016 | Meyer et al. |
| 2018/0219133 | A1 * | 8/2018 | Park ..................... H01L 33/46 |
| 2020/0006596 | A1 * | 1/2020 | Huang .................. H01L 33/46 |

FOREIGN PATENT DOCUMENTS

| | | |
|---|---|---|
| DE | 10 2012 112 302 | 6/2014 |
| DE | 10 2013 103 601 | 10/2014 |
| JP | 58-186979 | 11/1983 |
| JP | 2003-008057 | 1/2003 |
| WO | 01/39282 | 11/2000 |

* cited by examiner

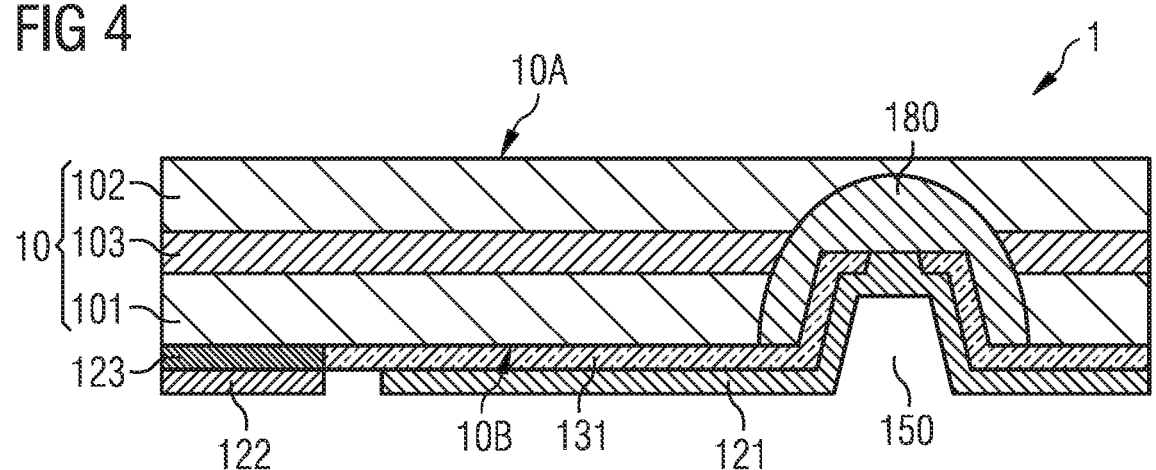
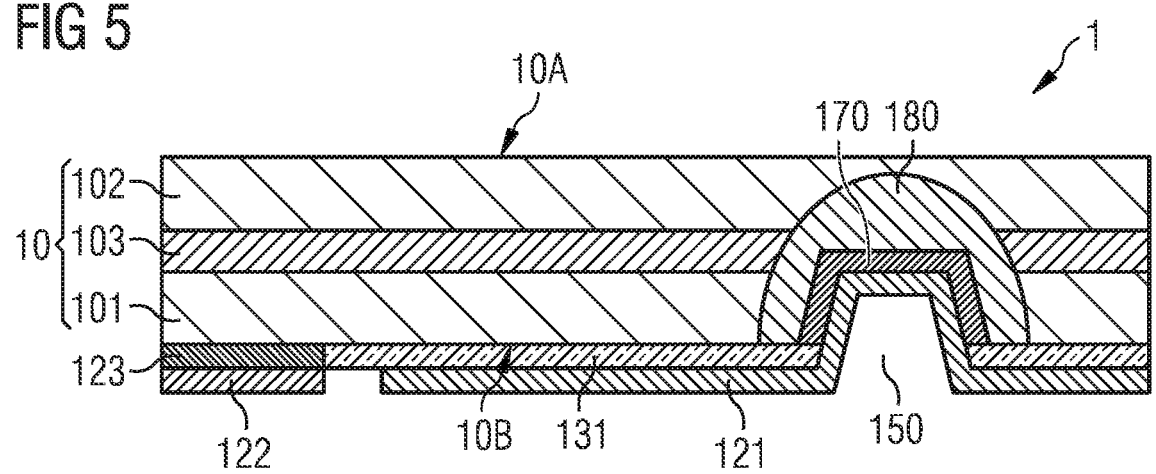

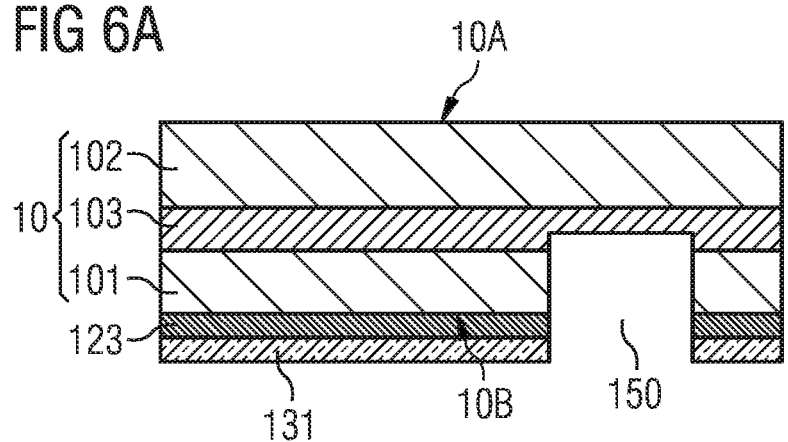
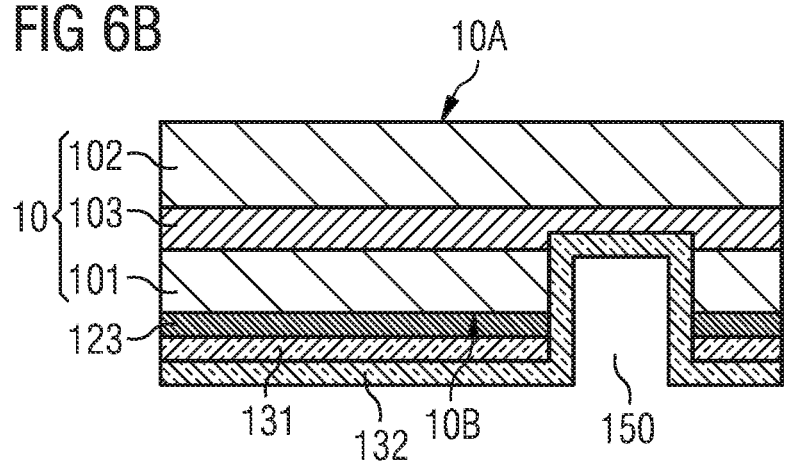
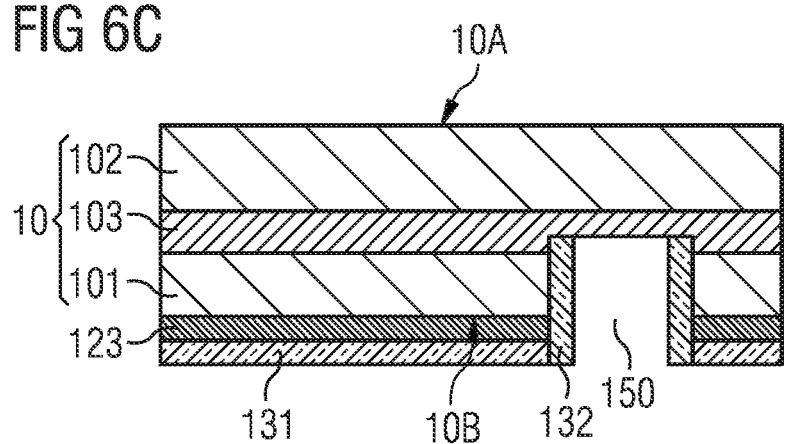

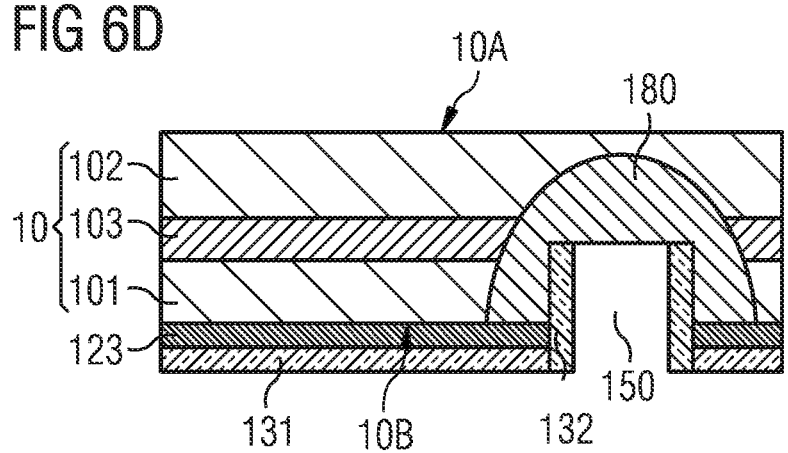
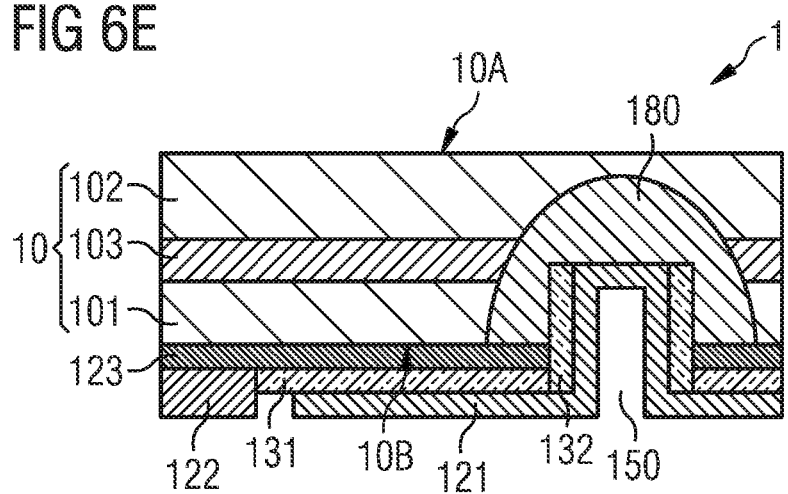
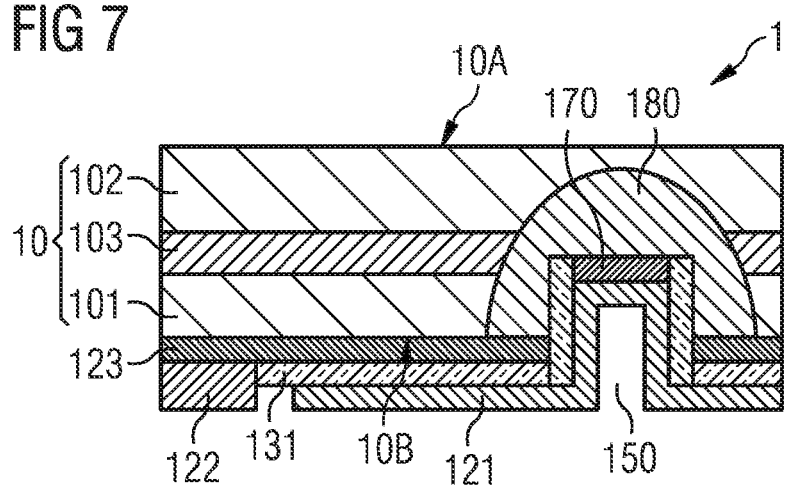

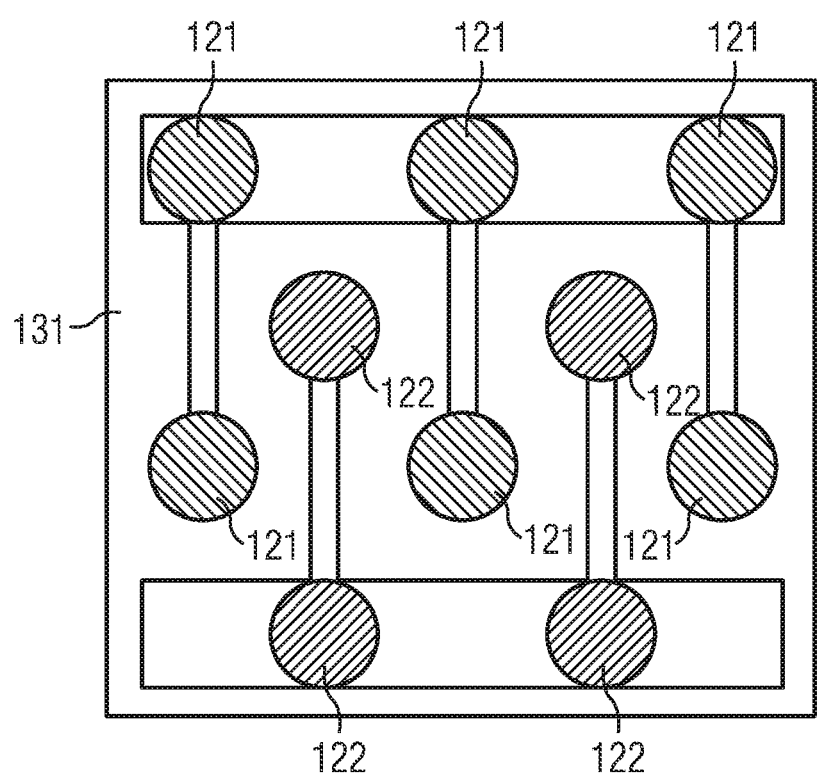

OPTOELECTRONIC COMPONENT AND METHOD OF MANUFACTURING AN OPTOELECTRONIC COMPONENT

TECHNICAL FIELD

This disclosure relates to an optoelectronic component and a method of manufacturing an optoelectronic component. The optoelectronic component can be, in particular, a radiation-emitting optoelectronic component that emits electromagnetic radiation such as light during operation.

BACKGROUND

There is a need to provide an optoelectronic component having improved efficiency and a method of manufacturing such an optoelectronic component.

SUMMARY

We provide an optoelectronic component including a semiconductor layer sequence including a first semiconductor layer of a first conductivity type, a second semiconductor layer and an active layer that generates electromagnetic radiation, wherein the active layer is disposed between the first semiconductor layer and the second semiconductor layer, a recess in the first semiconductor layer, a front side provided for coupling out the electromagnetic radiation, a first electrical connection layer and a second electrical connection layer disposed on a rear side opposite the front side, wherein the first electrical connection layer is arranged at least partially in the recess, and a contact zone with a dopant of a second conductivity type different from the first conductivity type, wherein the contact zone adjoins the recess, and the first semiconductor layer and the second semiconductor layer are highly doped to prevent diffusion of the dopant from the contact zone into the first semiconductor layer and diffusion of the dopant from the contact zone into the second semiconductor layer.

We also provide a method of manufacturing the optoelectronic component including a semiconductor layer sequence including a first semiconductor layer of a first conductivity type, a second semiconductor layer and an active layer that generates electromagnetic radiation, wherein the active layer is disposed between the first semiconductor layer and the second semiconductor layer, a recess in the first semiconductor layer, a front side provided for coupling out the electromagnetic radiation, a first electrical connection layer and a second electrical connection layer disposed on a rear side opposite the front side, wherein the first electrical connection layer is arranged at least partially in the recess, and a contact zone with a dopant of a second conductivity type different from the first conductivity type, wherein the contact zone adjoins the recess, and the first semiconductor layer and the second semiconductor layer are highly doped to prevent diffusion of the dopant from the contact zone into the first semiconductor layer and diffusion of the dopant from the contact zone into the second semiconductor layer, including manufacturing the contact zone by diffusion or ion implantation.

BRIEF DESCRIPTION OF THE DRAWINGS

FIG. 4 is a schematic cross section through an optoelectronic component according to an eleventh design example.

FIG. 5 is a schematic cross section through an optoelectronic component according to a twelfth example.

FIGS. 6A to 6E are schematic cross sections through an optoelectronic component at different steps of a method of manufacturing.

FIG. 7 is a schematic cross section through an optoelectronic component according to a thirteenth example.

FIG. 10 is a schematic top view of the contact structure of an optoelectronic component according to a second example.

Figure 1:
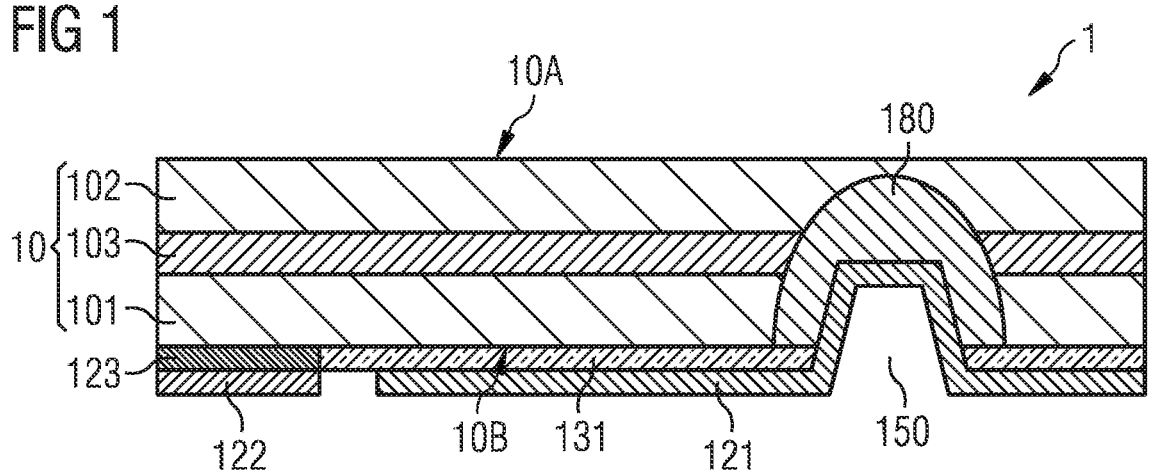
FIG. 1 is a schematic cross section through an optoelectronic component according to a first example.

LIST OF REFERENCE SIGNS 1 optoelectronic component
10 semiconductor layer sequence
10A front side
10B rear side
101 first semiconductor layer
102 second semiconductor layer
103 active layer
121 first electrical connection layer
122 second electrical connection layer
123 highly doped semiconductor connection layer
124 low doped semiconductor connection layer
131 electrically insulating separation layer
132 second electrically insulating separation layer
140 carrier layer
150 recess
160 current spreading layer
170 semiconductor contact layer
180 contact zone

DETAILED DESCRIPTION

Our optoelectronic component may comprise a semiconductor layer sequence comprising a first semiconductor layer of a first conductivity type, a second semiconductor layer and an active layer that generates electromagnetic radiation. The active layer may be disposed between the first and the second semiconductor layer. Preferably, the semiconductor layers are epitaxially grown. The active layer preferably comprises a pn junction, a double heterostructure, a single quantum well (SQW) or, preferably, a multi quantum well (MQW) for radiation generation. The term "quantum well structure" includes all dimensions with regard to quantization. It includes quantum troughs, quantum wires and quantum dots and any combination of such structures. Examples of MQW structures are described in WO 01/39282, U.S. Pat. Nos. 5,831,277, 6,172,382 B1 and 5,684,309, the subject matter of which is incorporated herein by reference.

The optoelectronic component may comprise a recess in the first semiconductor layer. The recess can have the shape of a trench, a cylinder or a truncated cone, for example. The cylinder axis or the truncated cone axis is preferably arranged orthogonal to the main extension plane. The main extension plane is preferably transverse, in particular perpendicular to the growth direction and/or to the stacking direction of the semiconductor layer sequence.

The optoelectronic component may comprise a front side provided for coupling out the electromagnetic radiation. This means that the optoelectronic component preferably emits electromagnetic radiation in the direction of the front side.

The optoelectronic component may comprise a first electrical connection layer and a second electrical connection layer arranged on a rear side opposite the front side. This makes it possible to form an uninterrupted emission surface on the front side of the optoelectronic component. The first electrical connection layer may be arranged, at least partially, in the recess. This means that the electronic contact is made from the rear side of the optoelectronic component. The electrical connection layers can, for example, be made of a metal.

The optoelectronic component may comprise a contact zone of a second conductivity type different from the first conductivity type, wherein the contact zone adjoins the recess. This contact zone may, for example, have a p-type conductivity and be intended for injecting holes. In particular, this contact zone may form an electrically conductive contact path from the first electrical connection layer located in the recess to the second semiconductor layer.

The optoelectronic component may comprise:
a semiconductor layer sequence comprising a first semiconductor layer of a first conductivity type, a second semiconductor layer and an active layer that generates electromagnetic radiation, wherein the active layer is disposed between the first and the second semiconductor layer,
a recess in the first semiconductor layer,
a front side for coupling out the electromagnetic radiation,
a first electrical connection layer and a second electrical connection layer arranged on a rear side opposite the front side, wherein the
first electrical connection layer is arranged at least partially in the recess,
and a contact zone of a second conductivity type different from the first conductivity type, wherein the contact zone adjoins the recess.

Our optoelectronic component is based, among other things, on the consideration that an uninterrupted surface for coupling out the generated radiation is advantageous for a high efficiency of the optoelectronic component. It is advisable to arrange the electrical connection layers on a rear side opposite the coupling-out surface for this purpose, wherein at least one electrical connection layer extends into a recess in the first semiconductor layer or is guided further through a through-hole in the form of a recess penetrating the first semiconductor layer. Defect areas in the semiconductor layer can occur on the side surfaces of such a recess. This can lead to an increase in non-radiative recombination of charge carriers and thus to a reduction in the efficiency of the optoelectronic component.

Our optoelectronic component now makes use of the idea of specifically adapting the type of conduction in a region adjacent to such a recess, for example, by doping such that a space charge region is advantageously generated that reduces a non-radiative recombination of charge carriers as well as a reabsorption of electromagnetic radiation.

The recess may completely penetrate the first semiconductor layer transverse to its main plane of extension. This means that the depth of the recess transverse to the main plane of the first semiconductor layer is greater than or at least equal to the thickness of the first semiconductor layer.

A non-radiative recombination in the vicinity of the recess may be suppressed by the contact zone of the second conductivity type. At the side faces of a recess penetrating the active zone transversely to its main plane of extension, the density of defects may be increased, thereby increasing the probability of non-radiative recombination processes. The contact zone creates a space charge region that keeps the charge carriers away from this area, thereby shifting the recombination of the charge carriers further into the active area and correspondingly reducing the probability of non-radiative recombination. This advantageously increases the optical efficiency of the optoelectronic component.

Forming a pn-junction at an outer edge of the semiconductor layer sequence can be advantageously avoided.

The first semiconductor layer may have an n-type conductivity and the second semiconductor layer may have a p-type conductivity. For example, a p-type conductivity can be produced by doping a semiconductor material with foreign atoms from the third main group of the periodic table. For example, an n-type contuctivity can be produced by doping a semiconductor material with foreign atoms from the fifth main group of the periodic table.

The first semiconductor layer and the second semiconductor layer may have a larger band gap than the active layer. This results in a spatial limitation for the charge carriers in the active layer and an increased recombination probability in the active layer. In addition, the probability of reabsorption of electromagnetic radiation emitted from the active layer in the first and second semiconductor layers is advantageously reduced.

The contact zone may be doped with a dopant of the second conductivity type. This means that the contact zone is a region in the existing semiconductor layers in which a dopant of the second conductivity type has been introduced.

The contact zone may have a doping containing zinc or magnesium or consisting of zinc and/or magnesium. Zinc or magnesium are particularly suitable for creating the contact zone by diffusion.

The semiconductor layer of the first type and the semiconductor layer of the second type may be highly doped to suppress or even prevent diffusion of the dopant from the contact zone into the first and second semiconductor layers. Thus, the vertical expansion of the contact zone is limited to the vertical expansion of the active layer.

An electrically insulating separation layer may be at least partially located between the first semiconductor layer and the first electrical connection layer. The electrically insulating separation layer can, for example, be formed or consist of a dielectric such as $SiO_2$ or $Si_3N_4$.

The electrically insulating separation layer between the first semiconductor layer and the first electrical connection layer may also cover the side walls of the recess and part of its bottom surface. This means that the first electrical connection layer may only be in contact with the contact zone in places. By covering the side walls of the recess with a dielectric, reflectivity of the side walls increases for the electromagnetic radiation emitted in the active layer and coupling out efficiency of the optoelectronic component is advantageously increased.

The current flow from the contact zone to the first semiconductor layer may be suppressed, in particular the current flow may be suppressed by the space charge zone formed between the contact zone and the first semiconductor layer. In other words, the forward voltage of the junction from the contact zone to the active layer and the forward voltage of the junction from the contact zone to the second semiconductor layer may be lower than the forward voltage of the junction from the contact zone to the first semiconductor layer. This also prevents a short circuit of the contact zone with the second electrical connection layer.

A current spreading layer may be arranged on the second semiconductor layer. This current spreading layer can, for example, be made of a translucent or transparent, electrically conductive material, preferably a TCO (Transparent Conductive Oxide) such as indium tin oxide (ITO). Due to the high electrical conductivity, the current from the locally limited contact zones is distributed evenly over the entire component surface and generation of electromagnetic radiation in the active layer is advantageously homogenized over the entire component.

The surface of the second semiconductor layer may be structured. This structuring can be carried out, for example, in the form of small pyramids and reduces the optical waveguide properties of the optoelectronic component. Other regular and irregular geometric shapes are also useful for structuring the surface. This increases the coupling out efficiency of the optoelectronic component.

A carrier layer may be applied to the second semiconductor layer. The carrier layer may be made of a material transparent to the electromagnetic radiation generated in the active layer. For example, the carrier can be used to mechanically stabilize the optoelectronic component. The interface between the carrier and the optoelectronic component can be structured to improve light extraction.

The recess may completely penetrate the first semiconductor layer and the active layer transverse to its main plane of extension. Compared to a recess that only partially penetrates the active layer, this can, for example, be an advantage in an etching process since the requirements for controlling the etching depth are advantageously reduced.

Reabsorption of electromagnetic radiation in the contact zone may be suppressed. The presence of the contact zone disturbs the structure of the active layer in this locally confined area, increasing the bandgap of the semiconductor material in this area by quantum well intermixing. As a result, the reabsorption probability for electromagnetic radiation in this region decreases advantageously.

The second semiconductor layer may have the same conductivity type as the first semiconductor layer. Thus, charge carriers may be injected directly from the contact zone into the active layer. The second semiconductor layer may enclose the charge carriers in the active layer and thus increases the probability of recombination.

At least one semiconductor layer may be based on a phosphide compound semiconductor material. "Phosphide compound semiconductor material based" means that the semiconductor layer sequence or at least a part thereof, particularly preferably at least the active layer and/or the growth substrate wafer, preferably comprises $Al_nGa_mIn_{1-n-m}P$ or $As_nGa_mIn_{1-n-m}P$, wherein $0 \leq n \leq 1$, $0 \leq m \leq 1$ and $n+m \leq 1$. This material does not necessarily have to have a mathematically exact composition according to the above formula. Rather, it may contain one or more dopants and additional constituents. For the sake of simplicity, the above formula contains only the essential components of the crystal lattice (Al or As, Ga, In, P), even if they may be partially replaced by small amounts of other substances. Advantageously, the design forms and examples allow formation of a semiconductor layer sequence based on a phosphide compound semiconductor material that is free of arsenic. This avoids the use of poorly environmentally compatible arsenic compounds.

At least one semiconductor layer may be based on an arsenide compound semiconductor material. "Based on arsenide compound semiconductor material" means that the semiconductor layer sequence or at least a part thereof, particularly preferably at least the active layer and/or the growth substrate wafer, preferably comprises $Al_nGa_mIn_{1-n-m}As$, wherein $0 \leq n \leq 1$, $0 \leq m \leq 1$ and $n+m \leq 1$. This material does not necessarily have to have a mathematically exact composition according to the above formula. Rather, it may contain one or more dopants and additional components. For the sake of simplicity, the above formula contains only the essential components of the crystal lattice (Al or As, Ga, In), even if they may be partially replaced by small amounts of other substances.

At least one semiconductor layer may be based on a nitride compound semiconductor material. "Based on nitride compound semiconductor material" means that the semiconductor layer sequence or at least a part thereof, particularly preferably at least the active zone and/or the growth substrate wafer, comprises or consists of a nitride compound semiconductor material, preferably $Al_nGa_mIn_{1-n-m}N$, wherein $0 \leq n \leq 1$, $0 \leq m \leq 1$ and $n+m \leq 1$. This material does not necessarily have to have a mathematically exact composition according to the above formula. Rather it can exhibit, for example, one or more dopants as well as additional components. For the sake of simplicity, the above formula contains only the essential components of the crystal lattice (Al, Ga, In, N), even if they may be partially replaced and/or supplemented by small amounts of other substances. Advantageously, the design forms and examples enable formation of a semiconductor layer sequence based on a nitride compound semiconductor material that is free of arsenic. This avoids the use of poorly environmentally compatible arsenic compounds.

The front side intended for the coupling out of electromagnetic radiation may be free of electrical connection layers. This results in a rear side-contactable optoelectronic component having an uninterrupted emission surface on its front side. This design is advantageous, for example, for the manufacture of very small optoelectronic components in which the electrical contacts would otherwise occupy a large area relative to their emission area.

In our method of manufacturing an optoelectronic component, the contact zone may be manufactured by diffusion or ion implantation. Zinc or magnesium, for example, are particularly suitable as dopants.

Further advantages and further design examples of the optoelectronic component result from the following examples/configurations shown in connection with the figures.

Same, similar or equivalent elements are provided with the same reference signs in the figures. The figures and the proportions of the elements depicted in the figures are not to be regarded as true to scale. Rather, individual elements may be exaggeratedly large for better representability and/or better comprehensibility.

FIG. 1 shows a first example of an optoelectronic component 1. The optoelectronic component 1 comprises a semiconductor layer sequence 10 with a first semiconductor layer 101 which is n-doped, a second semiconductor layer 102 which is p-doped and an active layer 103. The active layer 103 is arranged between the first semiconductor layer 101 and the second semiconductor layer 102. The optoelectronic component has a recess 150 that completely penetrates the first semiconductor layer 101 transverse to its main plane of extension.

A first electrical connection layer 121 and a second electrical connection layer 122 are attached to a rear side 10B of the optoelectronic component 1 to contact the optoelectronic component 1. These electrical connection layers can, for example, be made of a metal such as aluminum. The second electrical connection layer 122 contacts a preferably highly n-doped semiconductor connection layer 123. The first electrical connection layer 121 is further arranged at least partially in the recess 150.

Between the first electrical connection layer 121 and the first semiconductor layer 101 there is an electrically insulating separation layer 131 preferably made of silicon dioxide. The combination of such an electrically insulating separation layer 131 and a first electrical, preferably metallic connection layer 121 has advantageously good optical reflection properties. This increases the efficiency of optoelectronic component 1.

The semiconductor layer sequence 10 further comprises a contact zone 180 located in the region around the recess 150. This contact zone 180 forms a region within the semiconductor layer sequence 10 characterized by p-doping. The contact zone 180 forms a contact path between the first electrical connection layer 121 and the second semiconductor layer 102. The contact zone 180 also forms a space charge zone that prevents direct current flow from the first electrical connection layer 121 into the first semiconductor layer 101 and shifts the recombination process of the injected charge carriers in the active layer 103 or suppresses it in the vicinity of the recess 150. In the vicinity of recess 150 there are many defects due to the manufacturing process that serve as recombination centers for non-radiative processes. Thus, the radiating recombination probability can be advantageously increased by displacing the charge carriers from this area.

Figure 2A:
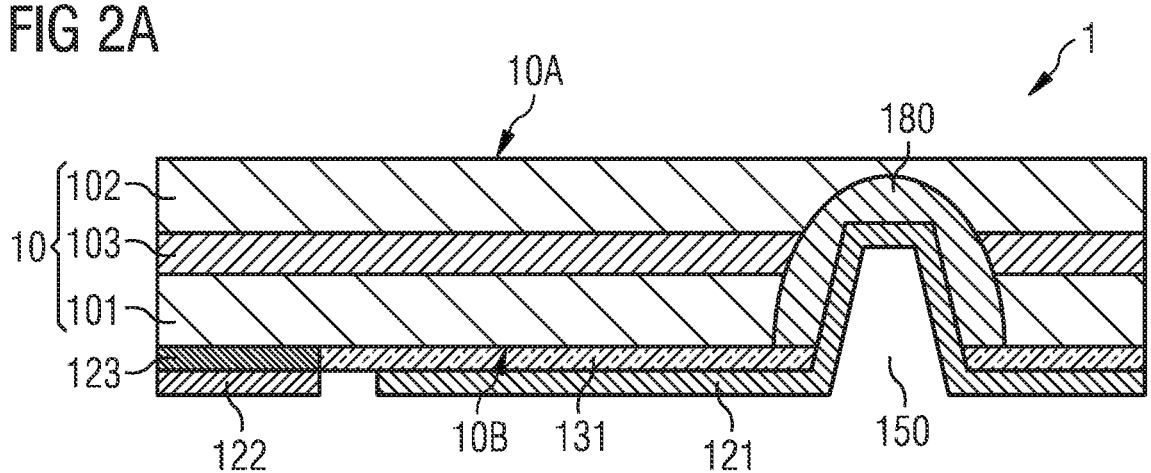
FIG. 2A is a schematic cross section through an optoelectronic component according to a second example.

FIG. 2A shows a schematic cross section through an optoelectronic component 1 according to a second example of an optoelectronic component 1. The example shown here corresponds to the first example shown in FIG. 1, but differs from the first example in the depth of the recess 150. The recess 150 not only completely penetrates the first semiconductor layer 101 transverse to its main extension plane, but also the active layer 103. This can be an advantage in an etching process, for example, since it advantageously reduces the requirements for controlling the etching depth.

Figure 2B:
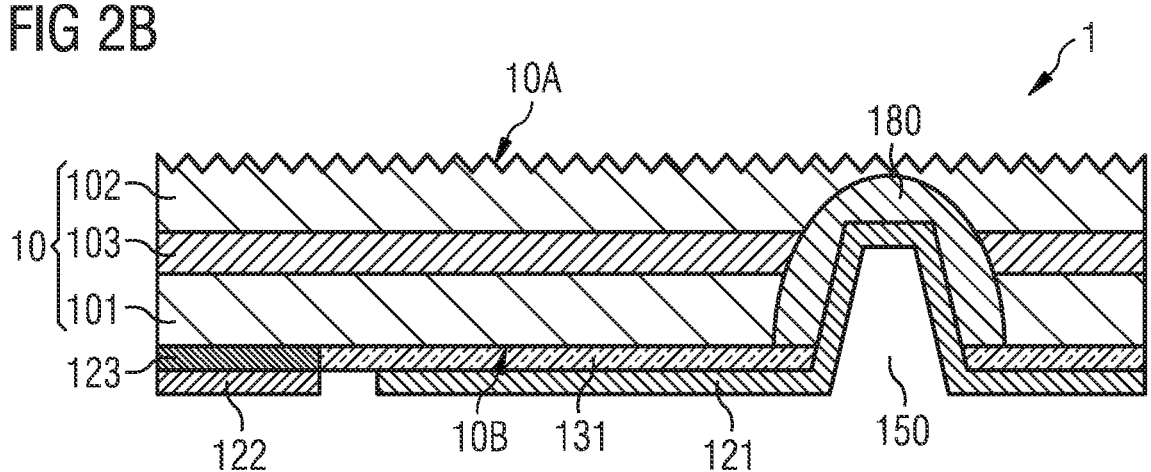
FIG. 2B is a schematic cross section through an optoelectronic component according to a third example.

FIG. 2B shows a schematic cross section through an optoelectronic component 1 according to a third example. This example corresponds to the second example shown in FIG. 2A, but differs from this example in that the surface of the front side of the 10A component is roughened on the outcoupling side. This surface structuring increases the coupling out efficiency and reduces the disadvantageous optical waveguide properties of the component surface. Pyramid-shaped structures, for example, are suitable for structuring. Other geometric shapes can also prove useful.

Figure 2C:
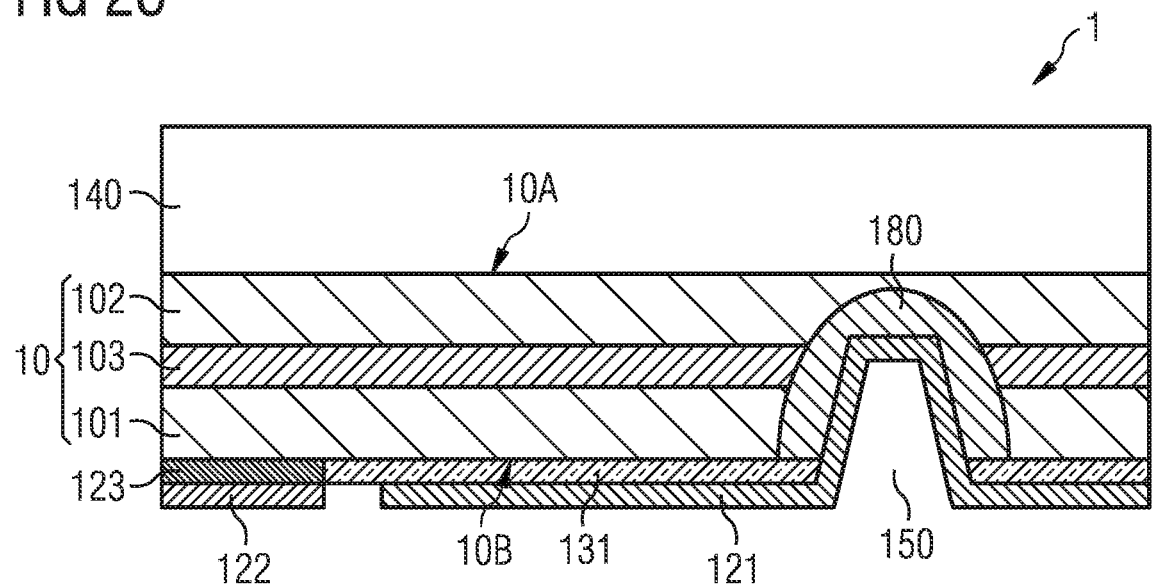
FIG. 2C is a schematic cross section through an optoelectronic component according to a fourth example.

FIG. 2C shows a schematic cross section through an optoelectronic component 1 according to a fourth example. The example shown here corresponds to the second example shown in FIG. 2A, but differs from the second example by an additional transparent carrier layer 140. In this example, a transparent carrier layer 140 is applied to the second semiconductor layer 102. This carrier layer 140 can increase the mechanical stability of optoelectronic component 1.

Figure 2D:
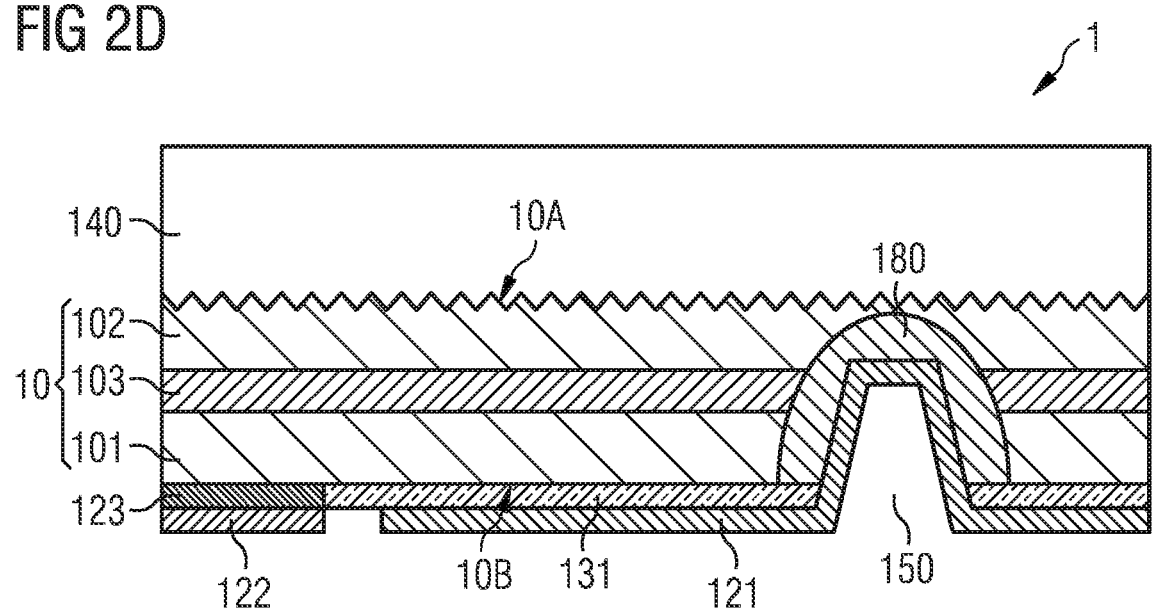
FIG. 2D is a schematic cross section through an optoelectronic component according to a fifth example.

FIG. 2D shows a schematic cross section through an optoelectronic component 1 according to a fifth example. The example shown here corresponds to the fourth example shown in FIG. 2C, but differs from the fourth example by an additionally roughened interface between the transparent carrier layer 140 and the second semiconductor layer 102. This structuring advantageously increases the optical coupling out efficiency of the optoelectronic component 1.

Figure 2E:
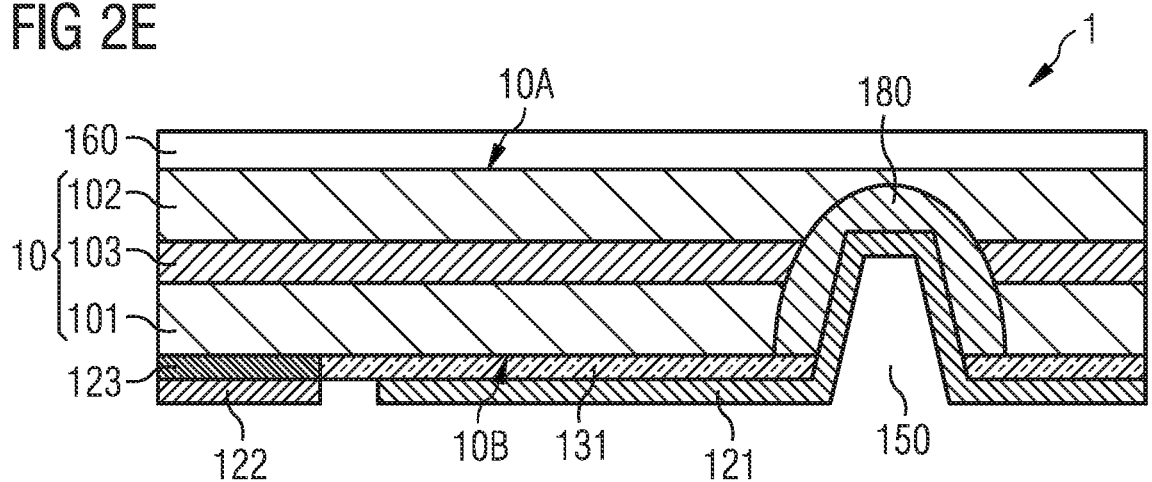
FIG. 2E is a schematic cross section through an optoelectronic component according to a sixth example.

FIG. 2E shows a schematic cross section of an optoelectronic component 1 according to a sixth example. The example shown here corresponds to the second example shown in FIG. 2A, but differs from the second example by an additional current spreading layer 140. This current spreading layer 140 is arranged on the second semiconductor layer 102 and formed, for example, from a transparent electrically conductive oxide such as indium tin oxide (ITO). Due to the high electrical conductivity of this current spreading layer 160, the charge carriers are advantageously injected evenly over the component surface into the semiconductor layer sequence, thus achieving a more homogeneous luminance.

Figure 2F:
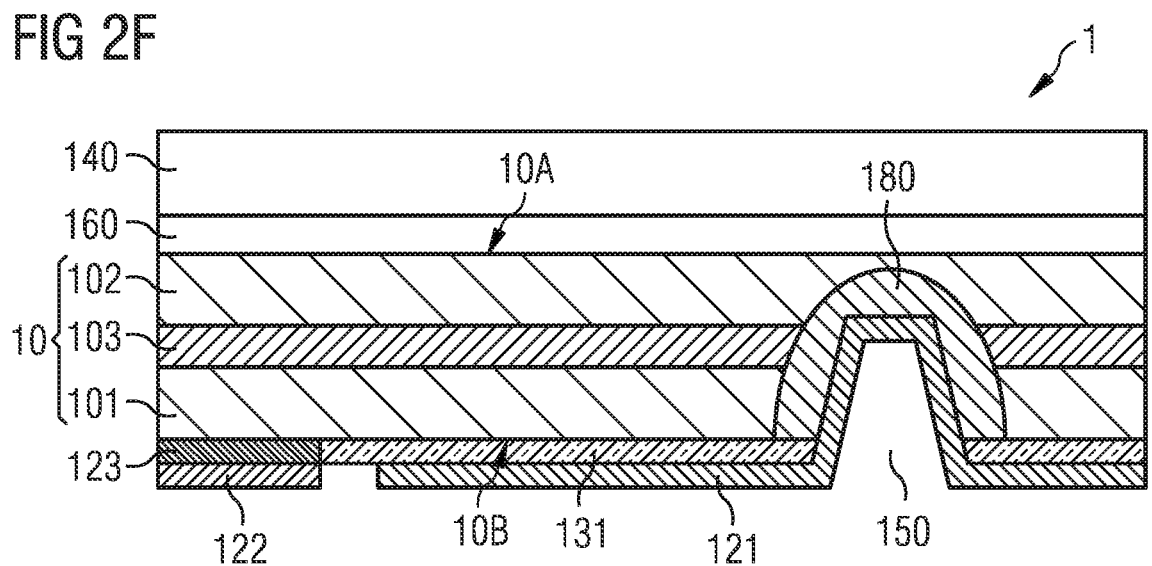
FIG. 2F is a schematic cross section through an optoelectronic component according to a seventh example.

FIG. 2F shows a schematic cross section through an optoelectronic component 1 according to a seventh example. The example shown here corresponds to the sixth example shown in FIG. 2E, but differs from the sixth example by an additional transparent carrier layer 140. A current spreading layer 160 is first applied to the second semiconductor layer on which a transparent carrier layer 140 is arranged.

Figure 2G:
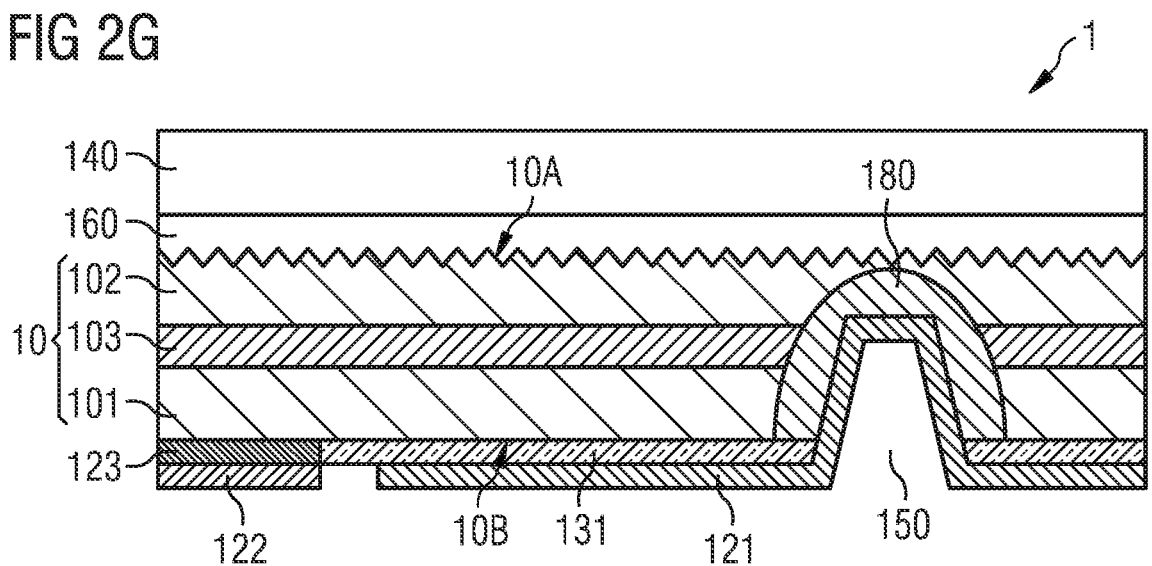
FIG. 2G is a schematic cross section through an optoelectronic component according to an eighth example.

FIG. 2G shows a schematic cross section through an optoelectronic component 1 according to an eighth example. The example shown here corresponds to the seventh example shown in FIG. 2F, but differs from the seventh example by an additionally structured interface between the second semiconductor layer 102 and the current spreading layer 160. This interface structuring advantageously increases the coupling out efficiency of the optoelectronic component 1.

Figure 3A:
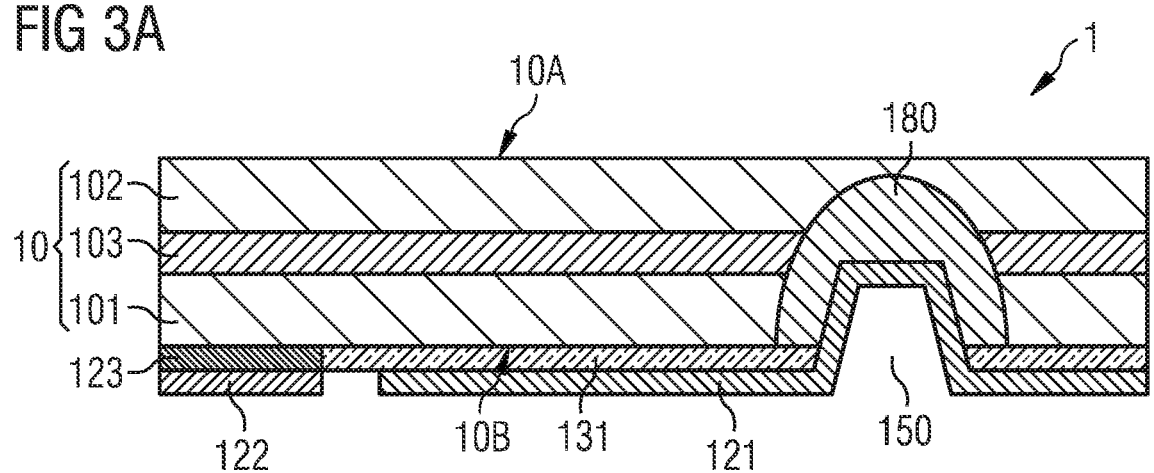
FIG. 3A is a schematic cross section through an optoelectronic component according to a ninth example.

FIG. 3A shows a schematic cross section through an optoelectronic component 1 according to a ninth example. The example shown here corresponds to the first example shown in FIG. 1, but differs from the first example by the different doping of the second semiconductor layer 102. In this example, both the first semiconductor layer 101 and the second semiconductor layer 102 are n-doped and the contact zone 180 is p-doped. Due to the space charge region of the p-doped contact zone 180, both the junction from the contact zone 180 to the second semiconductor layer 102 and the junction from the contact zone 180 to the first semiconductor layer 101 are now blocked. This results in a direct injection of the positive charge carriers from the contact zone 180 into the active layer 103. The n-doped second semiconductor layer 102, for example, improve the local confinement of the charge carriers in the active layer 103.

Figure 3B:
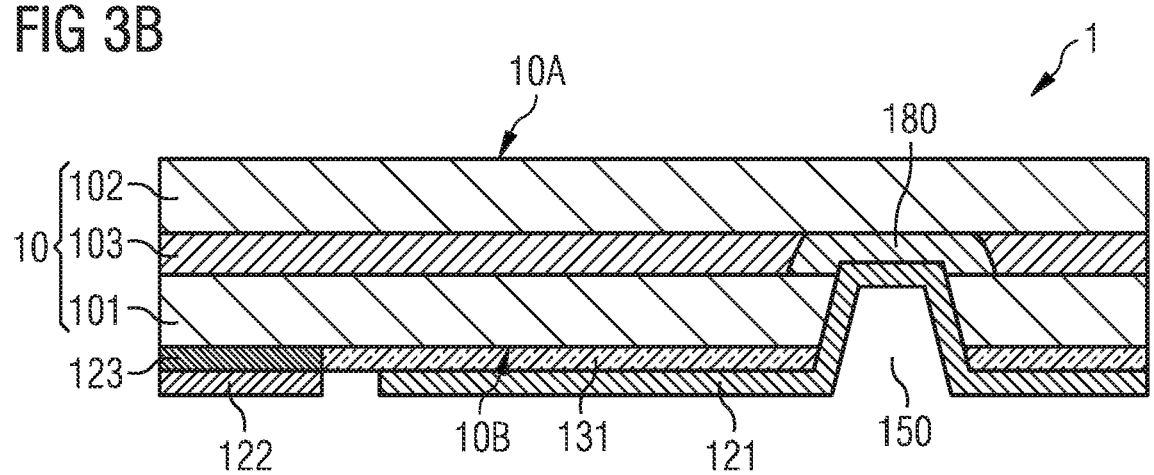
FIG. 3B is a schematic cross section through an optoelectronic component according to a tenth example.

FIG. 3B shows a schematic cross section through an optoelectronic component 1 according to a tenth example. The example shown here corresponds to the ninth example shown in FIG. 3A, but differs from the example by an increased dopant concentration in the two n-doped semiconductor layers 101 and 102. The dopant concentration in the two n-semiconductor layers 101 and 102 is so high that diffusion of the p-dopants from the contact zone 180 into the first semiconductor layer 101 and the second semiconductor layer 102 is suppressed or prevented. Since the high dopant concentration in the first semiconductor layer 101 and the second semiconductor layer 102 suppresses or prevents diffusion of the p-dopant in the contact zone 180 to the surface 10A of the optoelectronic component 1, the layers of this component can be thinner, thus reducing the manufacturing effort for the component as a whole.

FIG. 4 shows a schematic cross section through an optoelectronic component 1 according to an eleventh example. The example shown here corresponds to the first example shown in FIG. 1, but differs from the first example by a larger extension of the electrically insulating separation layer 131 in the area of recess 150. In this example, the electrically insulating separation layer 131 also covers the side walls of recess 150 and part of the bottom surface. Thus, only a small part of the electrical connection layer 121 remains in contact with contact zone 180. By covering the side surfaces and part of the bottom surface of the recess 150 with the electrically insulating separation layer 131, a better reflective property is achieved at this interface and thus the efficiency of the optoelectronic component 1 is advantageously increased.

FIG. 5 shows a schematic cross section through an optoelectronic component 1 according to a twelfth example. With the exception of an additional semiconductor contact layer 170, this example corresponds to the first example. The semiconductor contact layer 170, for example, is formed from a highly p-doped gallium phosphide or a highly p-doped aluminum gallium arsenide. It serves above all to reduce the contact resistance from the first electrical connection layer 121 to the contact zone 180.

FIGS. 6A to 6E show a method of manufacturing an optoelectronic component 1 according to a first example in schematic sectional views at different steps of the method. FIG. 6A shows a semiconductor layer sequence 10 with a first semiconductor layer 101, a second semiconductor layer 102 and an active layer 103, as well as a highly doped semiconductor connection layer 123 and an electrically insulating separation layer 131. The front side 10A of the component couples out electromagnetic radiation. In the first method step, a recess 150 is introduced in this semiconductor layer sequence.

FIG. 6B shows the next method step in which a second electrically insulating separation layer 132 is applied to a rear side 10B of the optoelectronic component.

FIG. 6C shows the component after a directional etching process in which the regions of the electrically insulating separation layer 131 and 132 parallel to the main plane of the layer stack are preferably etched. This leaves residues of the second electrically insulating separation layer 132 on the side walls of the recess 150.

FIG. 6D shows a further method step in which the contact zone 180 is produced by diffusion.

FIG. 6E shows a method step in which the electrical contact layers are applied. The first electrical connection layer 121 is partially arranged in the recess 150 and the second electrical connection layer 122 is directly applied to the highly n-doped semiconductor connection layer 123.

FIG. 7 shows another example for an optoelectronic component 1 manufactured according to the method described in FIGS. 6A to 6E. In addition, the optoelectronic component 1 shown in FIG. 7 has a semiconductor contact layer 170 at the transition of the first electrical connection layer 121 to the contact zone 180. This semiconductor contact layer 170 is formed from InAlGaAs:p+ or InGaP:p+ or InGaAs, for example. This advantageously reduces the contact resistance from the first electrical connection layer 121 to the contact zone 180.

Figure 8:
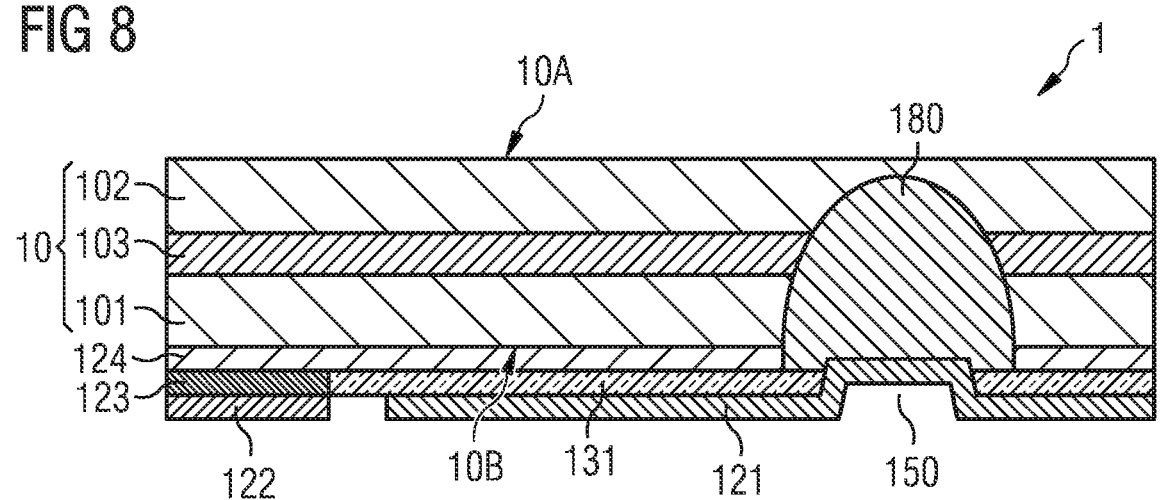
FIG. 8 is a schematic cross section through an optoelectronic component according to a fourteenth example.

FIG. 8 shows a schematic cross section through an optoelectronic component 1 according to a fourteenth example. The example shown here corresponds to the first example shown in FIG. 1, but differs from the first example in the depth of the recess 150 and an additional semiconductor connection layer 124. The semiconductor connection layer 124 may, for example, include a low n-doped semiconductor based on InGaAlP. The contact zone 180 extends from the first electrical connection layer 121 to the second semiconductor layer 102. The recess 150 does not penetrate the first semiconductor layer 101, but only penetrates the electrically insulating separation layer 131 transverse to its main plane of extension. This can, for example, be an advantage for the efficiency of the optoelectronic component 1, because compared to a deeper recess completely penetrating the first semiconductor layer 101, the side surfaces of the recess and the resulting defect areas can be advantageously reduced.

Figure 9:
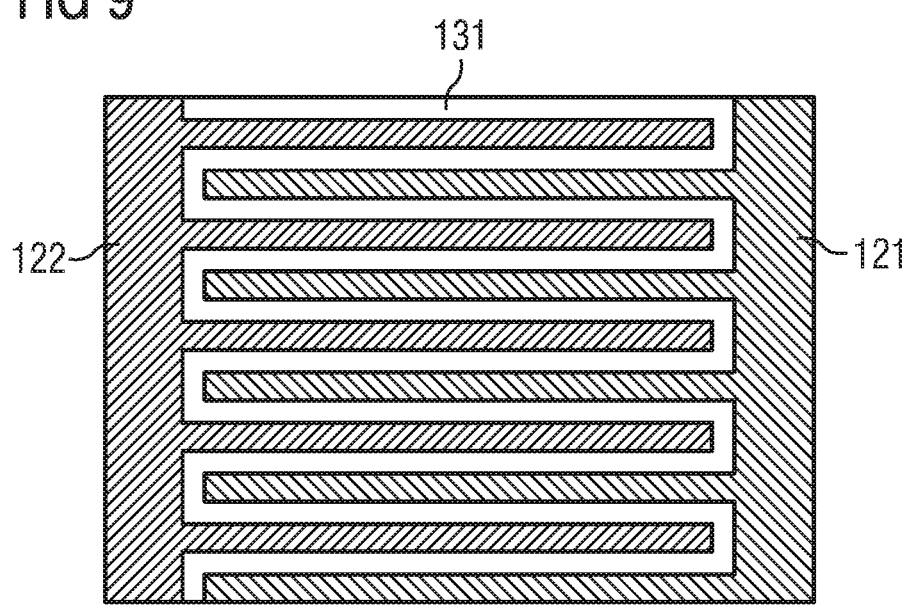
FIG. 9 is a schematic top view of the contact structure of an optoelectronic component according to a first example.

FIG. 9 shows a schematic top view of the contact structures of an optoelectronic component 1 according to a first example. The first electrical connection layer 121 is separated from the second electrical connection layer 122 by an electrically insulating separation layer 131. The finger-shaped contact layout has an advantageously low expansion with a comparatively large contact area.

FIG. 10 shows a schematic top view of the contact structure of an optoelectronic component 1 according to a second example. In this example, a large part of the electrical connection layers remains buried under an electrically insulating separation layer 131. Contacts are made by vias in the form of cylinders, cones or truncated cones.

Our components and methods are not limited by the description given in the examples. Rather, this disclosure includes each new feature as well as each combination of features, which in particular includes each combination of features in the appended claims, even if the feature or combination itself is not explicitly stated in the claims or examples.

This application claims priority of DE 102017112127.7, the subject matter of which is incorporated herein by reference.

The invention claimed is:

1. An optoelectronic component comprising:
    a semiconductor layer sequence comprising a first semiconductor layer of a first conductivity type, a second semiconductor layer and an active layer that generates electromagnetic radiation, wherein the active layer is disposed between the first semiconductor layer and the second semiconductor layer,
    a recess in the first semiconductor layer,
    a front side provided for coupling out the electromagnetic radiation,
    a first electrical connection layer and a second electrical connection layer disposed on a rear side opposite the front side, wherein the first electrical connection layer is arranged at least partially in the recess, and
    a contact zone with a dopant of a second conductivity type different from the first conductivity type,
    wherein the contact zone adjoins the recess, and
    the first semiconductor layer and the second semiconductor layer are highly doped to prevent diffusion of the dopant from the contact zone into the first semiconductor layer and diffusion of the dopant from the contact zone into the second semiconductor layer.

2. The optoelectronic component according to claim 1, wherein the recess completely penetrates the first semiconductor layer transverse to a main plane of extension.

3. The optoelectronic component according to claim 1, wherein a non-radiative recombination in the vicinity of the recess is suppressed by the contact zone of the second conductivity type.

4. The optoelectronic component according to claim 1, wherein the first semiconductor layer comprises an n-type conductivity and the second semiconductor layer comprises a p-type conductivity.

5. The optoelectronic component according to claim 1, wherein a bandgap of the first semiconductor layer and a bandgap of the second semiconductor layer is larger than a bandgap of the active layer.

6. The optoelectronic component according to claim 1, wherein the contact zone has a doping with a dopant of the second conductivity type.

7. The optoelectronic component according to claim 6, wherein the dopant contains zinc or magnesium or the dopant is zinc or magnesium.

8. The optoelectronic component according to claim 1, further comprising an electrically insulating separation layer at least partially located between the first semiconductor layer and the first electrical connection layer.

9. The optoelectronic component according to claim 8, wherein the electrically insulating separation layer between the first semiconductor layer and the first electrical connection layer covers side walls and part of a bottom surface of the recess.

10. The optoelectronic component according to claim 1, wherein current flow from the contact zone to the first semiconductor layer is suppressed.

11. The optoelectronic component according to claim 1, further comprising a current spreading layer arranged on the second semiconductor layer.

12. The optoelectronic component according to claim 1, wherein a surface of the second semiconductor layer is structured.

13. The optoelectronic component according to claim 1, further comprising a carrier layer transparent to electromagnetic radiation generated in the active layer arranged on the second semiconductor layer.

14. The optoelectronic component according to claim 1, wherein the recess completely penetrates the first semiconductor layer and the active layer transversely to their main plane of extension.

15. The optoelectronic component according to claim 1, wherein reabsorption of electromagnetic radiation in a region of the contact zone is suppressed.

16. The optoelectronic component according to claim 1, wherein the second semiconductor layer has the same conductivity type as the first semiconductor layer.

17. The optoelectronic component according to claim 1, wherein at least one semiconductor layer is based on a phosphide compound semiconductor material.

18. The optoelectronic component according to claim 1, wherein a front side intended for coupling out electromagnetic radiation is free of electrical connection layers.

19. A method of manufacturing the optoelectronic component according to claim 1, comprising manufacturing the contact zone by diffusion or ion implantation.

* * * * *